(12) United States Patent
Marui et al.

(10) Patent No.: US 10,147,862 B2
(45) Date of Patent: Dec. 4, 2018

(54) ELECTRONIC CONTROL DEVICE

(71) Applicant: DENSO CORPORATION, Kariya, Aichi-pref. (JP)

(72) Inventors: Daichi Marui, Kariya (JP); Masafumi Umeno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/653,672

(22) Filed: Jul. 19, 2017

(65) Prior Publication Data

US 2018/0040796 A1    Feb. 8, 2018

(30) Foreign Application Priority Data

Aug. 8, 2016  (JP) ................... 2016-155653
Jun. 7, 2017  (JP) ................... 2017-112529

(51) Int. Cl.
| H01L 35/32 | (2006.01) |
| H01L 35/30 | (2006.01) |
| H01L 35/10 | (2006.01) |
| H01L 35/26 | (2006.01) |
| H01L 21/02 | (2006.01) |

(52) U.S. Cl.
CPC .............. *H01L 35/32* (2013.01); *H01L 35/10* (2013.01); *H01L 35/30* (2013.01); *H01L 21/02576* (2013.01); *H01L 21/02579* (2013.01); *H01L 35/26* (2013.01)

(58) Field of Classification Search
CPC ......... H01L 35/00; H01L 35/02; H01L 35/32; H01L 35/325; H01L 27/16
See application file for complete search history.

(56) References Cited

U.S. PATENT DOCUMENTS

| 5,515,683 | A | * | 5/1996 | Kessler | .................... | F25B 21/04 |
| | | | | | | 62/3.3 |
| 2006/0107989 | A1 | * | 5/2006 | Bierschenk | ............. | H01L 35/32 |
| | | | | | | 136/212 |

(Continued)

FOREIGN PATENT DOCUMENTS

| JP | 2001196650 A | * | 7/2001 | ............. | H01L 35/32 |
| JP | 2008-198671 A | | 8/2008 | | |
| JP | 2015070067 A | * | 4/2015 | ............. | H01L 35/32 |

OTHER PUBLICATIONS

English abstract of Akiba et al. (JP 2001-196650), published Jul. 19, 2001.*

(Continued)

*Primary Examiner* — Christina Chern
(74) *Attorney, Agent, or Firm* — Posz Law Group, PLC

(57) ABSTRACT

An electronic control device includes: a thermoelectric element module that has a plurality of thermoelectric element groups, which are connected in parallel; and a control circuit that supplies a driving power to the thermoelectric element module to perform an operation control of the thermoelectric element module. Additionally, the plurality of thermoelectric element groups respectively have a plurality of thermoelectric elements, which are connected in series. Moreover, each of the plurality of thermoelectric elements is provided with a pair of a p-type semiconductor and an n-type semiconductor. Furthermore, the plurality of thermoelectric element groups have different number of the thermoelectric elements.

7 Claims, 10 Drawing Sheets

(56) References Cited

U.S. PATENT DOCUMENTS

| | | | | |
|---|---|---|---|---|
| 2007/0095378 A1 | 5/2007 | Ito et al. | | |
| 2012/0266930 A1* | 10/2012 | Toyoda | ............... | H01L 35/10 |
| | | | | 136/208 |
| 2016/0049570 A1* | 2/2016 | Okuzono | ............ | H01L 35/32 |
| | | | | 136/212 |
| 2016/0233402 A1* | 8/2016 | Suda | ................... | H01L 35/32 |
| 2016/0380174 A1* | 12/2016 | Ghoshal | ............ | H01L 35/325 |
| | | | | 136/212 |

OTHER PUBLICATIONS

English abstract of Kuroki et al. (JP 2015-070067), published Apr. 13, 2015.*

* cited by examiner

ELECTRONIC CONTROL DEVICE

CROSS REFERENCE TO RELATED APPLICATION

This application is based on Japanese Patent Application No. 2016-155653 filed on Aug. 8, 2016 and Japanese Patent Application No. 2017-112529 filed on Jun. 7, 2017, the disclosures of which are incorporated herein by reference.

TECHNICAL FIELD

The present disclosure relates to an electronic control device that prevents from the stoppage of conduction even when a thermoelectric element has an open circuit fault, and that detects a fault without separately providing a terminal such as an intermediate terminal.

BACKGROUND

Thermoelectric elements as electronic elements for transferring an electrical energy through heat conduction have been known. Since this type of thermoelectric elements, for example, a Peltier device is provided with a pair of a p-type semiconductor and an n-type semiconductor, this type of thermoelectric elements has a function for generating heating and cooling thermoelectric effects through current flow.

Since this conventional type of thermoelectric elements is used such that a plurality of thermoelectric elements are typically connected in series, a cooling function or a heating function may stop due to having an open circuit in the connection of thermoelectric elements and resulting in the stoppage of electrical conduction. Accordingly, this conventional type of electronic control devices such as the one disclosed in Patent Literature 1 for detecting the open circuit fault has been known.

However, with regard to the conventional type of electronic control devices, the application of this type of electronic control devices to a temperature control target becomes more difficult due to being incapable of controlling temperature when an open circuit fault occurs in the electronic control device. Additionally, since an intermediate terminal for detecting a fault is implemented in this conventional type of electronic control devices, the freedom of wiring or implementation is limited.

[Patent Literature 1] JP 2007-150231-A

SUMMARY

It is an object of the present disclosure to provide an electronic control device, which prevents from the stoppage of conduction even when a thermoelectric element has an open circuit fault and which detects a fault without separately providing a terminal such as an intermediate terminal.

An electronic control device according to an aspect of the present disclosure includes: a thermoelectric element module that includes a plurality of thermoelectric element groups, which are connected in parallel; and a control circuit that supplies a driving power to the thermoelectric element module to perform an operation control of the thermoelectric element module. Additionally, the plurality of thermoelectric element groups respectively have a plurality of thermoelectric elements, which are connected in series. Moreover, each of the plurality of thermoelectric elements is provided with a pair of a p-type semiconductor and an n-type semiconductor. Furthermore, the plurality of thermoelectric element groups have different number of the thermoelectric elements.

In the above-mentioned configuration, the control circuit controls an operation in which the driving power is supplied to the thermoelectric element module so that the plurality of thermoelectric element groups are conducted by electricity and a heat absorption function or a heat radiation function is carried out by a thermoelectric conversion process.

When an open circuit fault occurs in one of the plurality of thermoelectric element groups, the resistance value in the one of the plurality of thermoelectric element groups becomes infinity. Accordingly, the resistance value of the thermoelectric element module is the total resistance of a parallel circuit in which the plurality of thermoelectric element groups, which do not have an open circuit fault, are connected in parallel. Moreover, since the resistance values of the respective thermoelectric element groups are different, the resistance value of the thermoelectric element module changes in response to the situation in which one of the thermoelectric element groups has an open circuit fault. Accordingly, it is possible to specify one of the thermoelectric element groups, which has an open circuit fault, by measuring the resistance value of the thermoelectric element module.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION (First Embodiment)

The following describes a first embodiment of the present disclosure in reference to FIGS. 1 to 7. A thermoelectric element module 1 used in the present embodiment is arranged to be used for mounting on a heat-generating target such as a semiconductor device or a control device to be cooled down.

Figure 2:
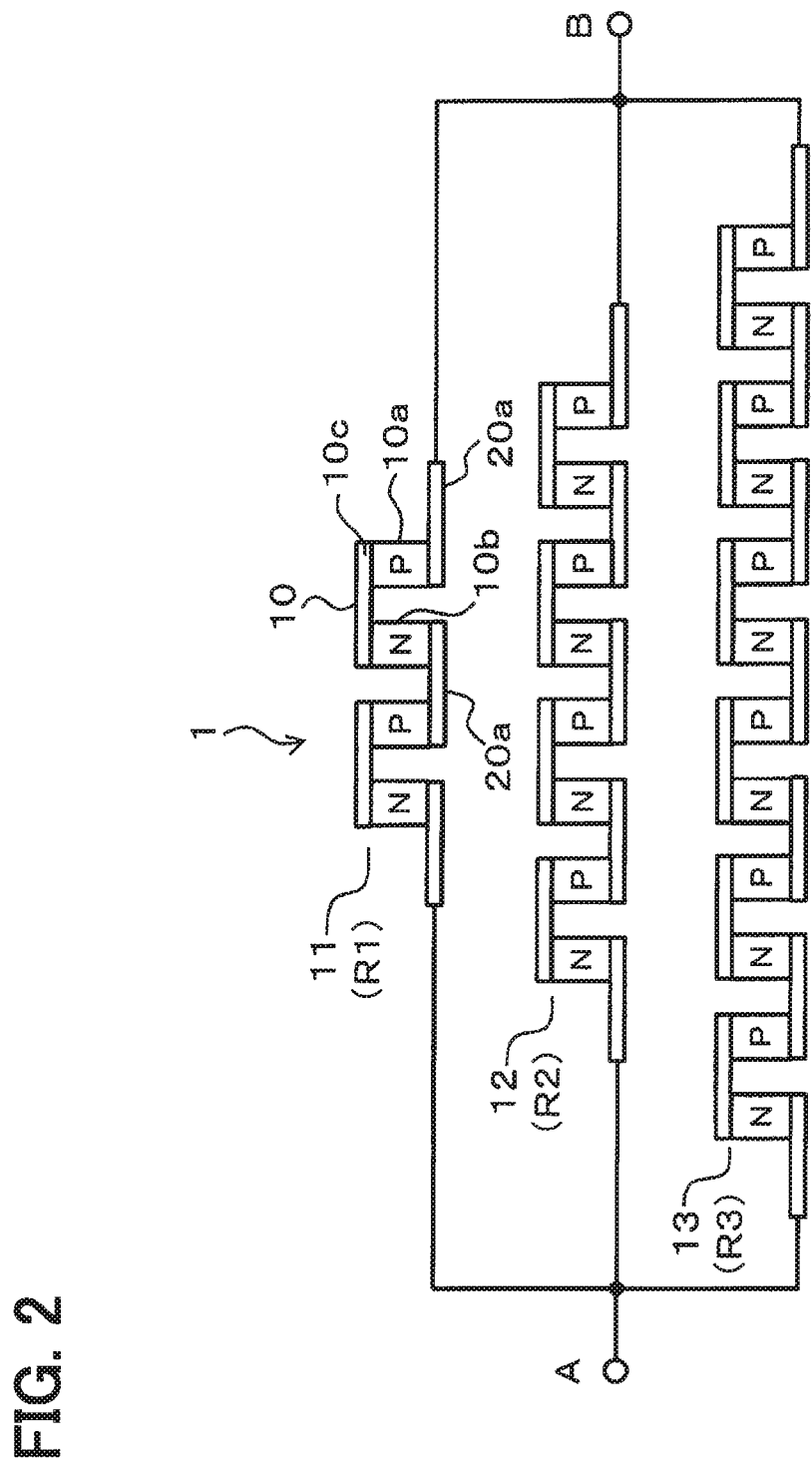
FIG. 2 is a drawing that illustrates an electrical configuration of the thermoelectric element module with the use of a thermoelectric element.
Figure 3:
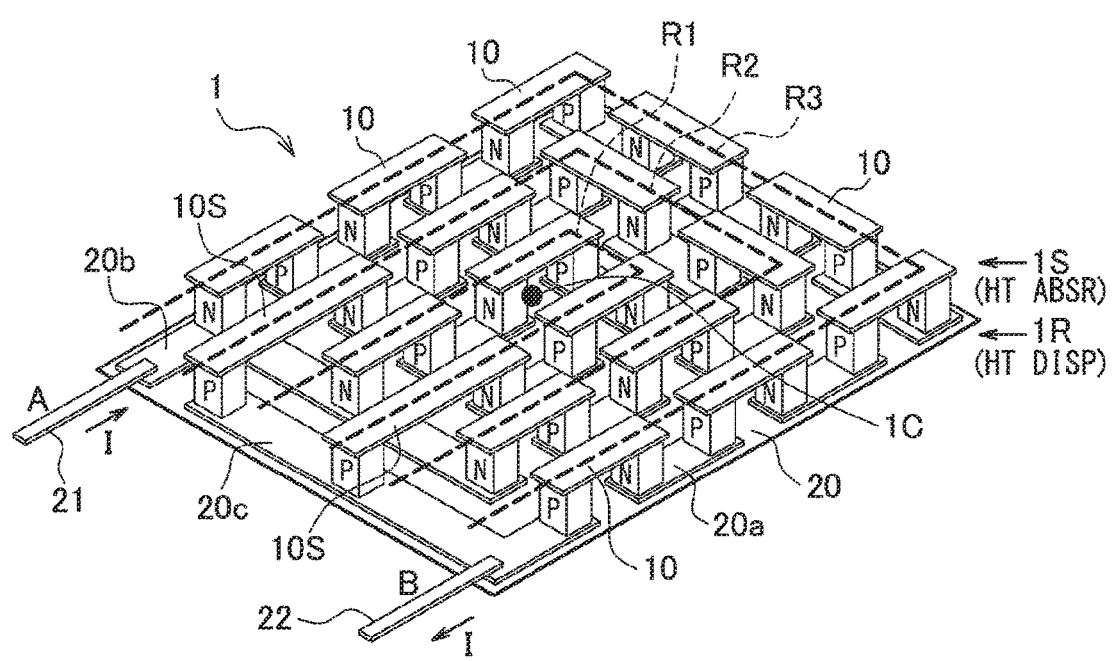
FIG. 3 is a drawing that illustrates a perspective view of the configuration of the thermoelectric element module.

In the thermoelectric element module 1, thermoelectric element groups 11, 12, 13 are connected in parallel. Additionally, thermoelectric element groups 11, 12, 13 respectively have different number of thermoelectric elements 10 connected in series. As illustrated in FIG. 2, the thermoelectric element 10 is an element such as a Peltier element having a heat radiation function at one side and a heat absorption function at another side by electrical conduction. With regard to the thermoelectric element 10, a p-type semiconductor 10a and an n-type semiconductor 10b are connected by a conductor 10c. Each of the thermoelectric element groups 11, 12, 13 is configured by connecting the plurality of thermoelectric elements 10 in series through a connection conductor 20a or the like.

Figure 4:
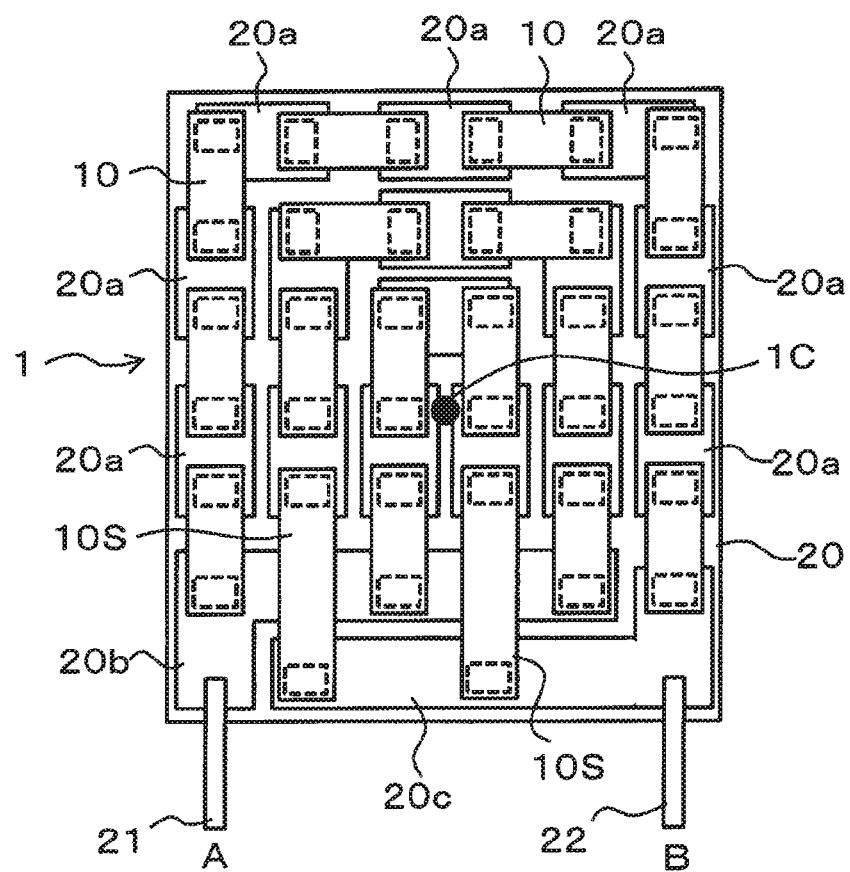
FIG. 4 is a drawing that illustrates a plan view of the configuration of the thermoelectric element module.

As illustrated in FIG. 4, in the thermoelectric element groups 11, 12, and 13, the number of thermoelectric elements 10 being connected in series are 4, 6 and 8 respectively. In addition, the respective resistance values of the thermoelectric element groups 11, 12 and 13 are defined as R1, R2 and R3. It is noted that FIG. 2 illustrates that two thermoelectric elements, four thermoelectric elements and six thermoelectric elements are respectively in the thermoelectric element groups 11, 12 and 13 for showing different number of thermoelectric elements in different thermoelectric element groups. The resistance values R1, R2 and R3 are configured such that the resistance value R2 is 1.5 times larger than the resistance value R1; and the resistance value R3 is 2 times larger than the resistance value R1. With regard to the thermoelectric element 10, a current flows from the n-type semiconductor 10b side to the p-type semiconductor 10a side. Accordingly, the temperature of the conductor 10c side drops and the thermoelectric element 10 absorbs heat from outside, and the temperature of the connection conductor 20a side rises and the thermoelectric element 10 dissipates heat to outside. Thus, with regard to the connection state illustrated in FIG. 2, the heat absorption and heat radiation operations can be attained by making the current flow from the terminal A at the n-type semiconductor 10b side to the terminal B at the p-type semiconductor 10a side.

Figure 1:
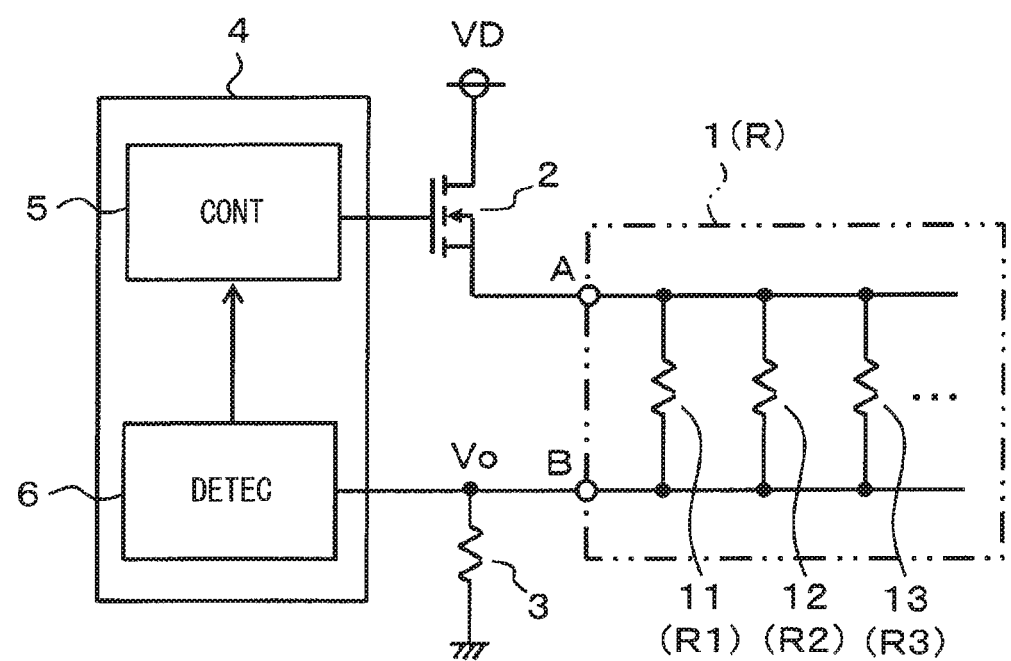
FIG. 1 is a drawing that illustrates an electrical configuration for driving a thermoelectric element module according to a first embodiment.

FIG. 1 illustrates an electrical configuration for driving the thermoelectric element module 1. The thermoelectric element module 1 is electrically conducted through an n-channel type MOSFET 2, which is driven by a current source VD. In addition, the thermoelectric element module 1 is connected to ground through the resistor 3 for detecting current. The resistor 3 for detecting current is set at the resistance value R0. A control circuit 4 includes a memory and an interface circuit anchored by a microcomputer. In addition, the control circuit 4 includes a step-up power source circuit for driving the high-side MOSFET 2.

The control circuit 4 controls the operation of the thermoelectric module 1 by sending a gate signal to the MOSFET 2 through a control program stored in the memory. The control circuit 4, as a functional configuration, includes a controller 5 and a detector 6 as shown in the figures. The detector 6 detects the current flowing through the thermoelectric element module 1 to determine an operation state. The controller 5 sets a duty ratio of a PWM signal sent to the MOSFET 2 based on the operation state of the thermoelectric element module 1 detected by the detector 6 to perform driving control.

Figure 5:
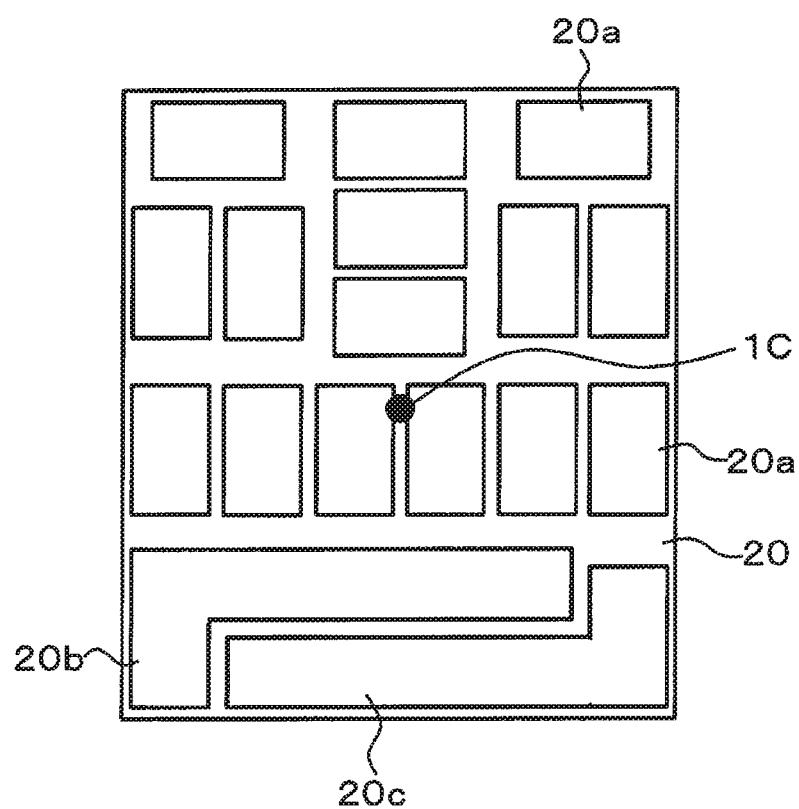
FIG. 5 is a drawing that illustrates a plan view of the configuration of a mounted board.

FIGS. 3 to 6 respectively illustrate the particular configuration of the thermoelectric element module 1. The plurality of thermoelectric elements 10 for configuring the thermoelectric element groups 11, 12 and 13 are arranged on a rectangular mounted board 20. As shown in FIG. 5, the connection conductors 20a to 20c for making electrical connection with each of the thermoelectric elements 10 are formed through patterning on the top surface of the mounted board 20. The connection conductor 20b is a conductor at the terminal A side where a lead wire 21 is connected; and the connection conductor 20c is a conductor at the terminal B side where a lead wire 22 is connected. The connection conductors 20b, 20c are aligned at one terminal side of the mounted board 20 for connecting three thermoelectric element groups 11 to 13 in parallel.

The eight thermoelectric elements 10 for configuring the thermoelectric element group 13 are aligned in a rectangular form at the outermost peripheral part of the top surface of the mounted board 20. The six thermoelectric elements 10 for configuring the thermoelectric element group 12 are connected in a rectangular form along the inner side of the thermoelectric element group 13. The four thermoelectric elements 10 for configuring the thermoelectric element group 11 are connected in a rectangular form along the further inner side of the thermoelectric element group 13. For one of the thermoelectric elements 10 connected between the connection conductor 20a and the connection conductor 20c in each of the thermoelectric element groups 11, 12, a thermoelectric element 10S, which is longer than the conductor 10c, is used.

Figure 6:
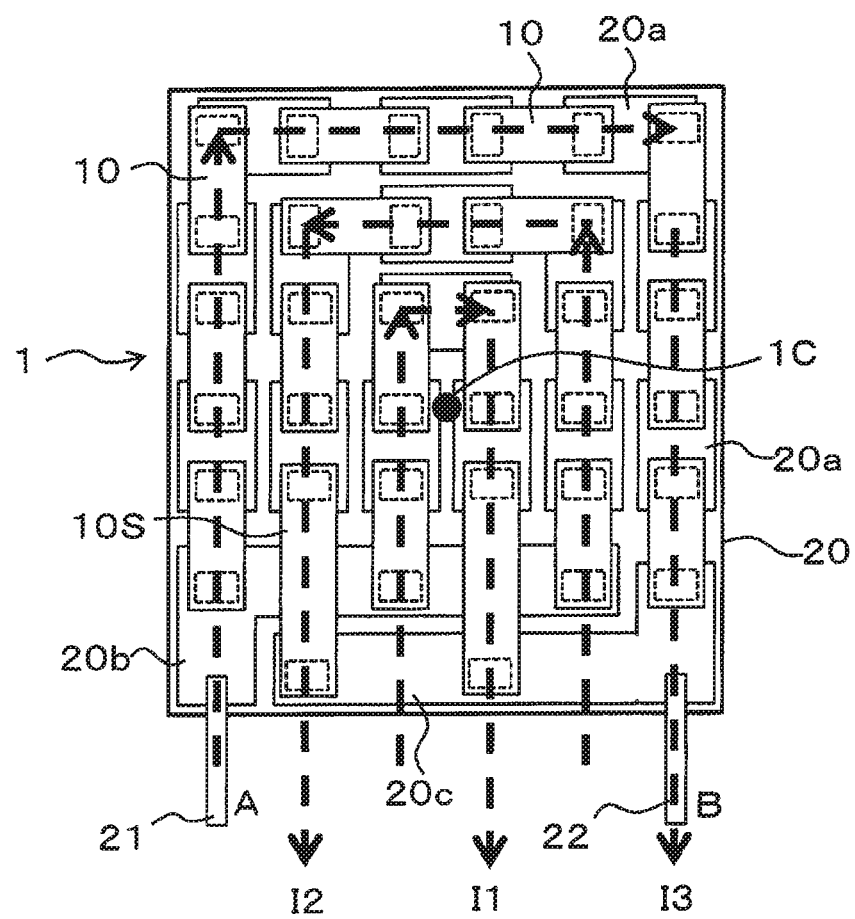
FIG. 6 is a drawing that illustrates a current flowing path in the thermoelectric element module.

FIG. 6 illustrates the current paths I1, I2 and I3 through the respective thermoelectric element groups 11, 12 and 13 at the time of the current I flowing from the terminal A side to the terminal B side with use of broken lines with arrow signs. For understanding these current paths, the currents I1, I2 and I3 flowing through the respective thermoelectric element groups 11, 12 and 13 are configured to flow in a direction, which is opposite to the flowing direction of the current through the adjacent thermoelectric element group. Accordingly, the noises generated by the currents I1, I2 and I3 flowing through the respective thermoelectric element groups 11, 12 and 13 can be inhibited by cancelling each other through the above configuration.

In addition, the thermoelectric element groups 11, 12 and 13 are set at the resistance values R1, R2 and R3 respectively, which are different from each other, and the resistance value R1 of the thermoelectric element group 11 is set to be the smallest value. Accordingly, the value of the current I1 is the largest, and the value of the current I3 is the smallest. Thus, the thermoelectric element group 11 has higher cooling ability, and the thermoelectric element groups 12 and 13 have sequentially lower cooling ability. The thermoelectric element group 11 is arranged at the center part of the mounted board 20 and is configured to have the highest cooling ability. The cooling ability gets lower towards the outer peripheral side of the mounted board 20.

Accordingly, the efficient cooling operation by placing the thermoelectric element group 11, which is mostly required to be cooled down, at the center part of the mounted board 20, in other words, at the position facing the center part 1C of the thermoelectric element module 1. Moreover, since the cooling ability is configured to get lower in a stepwise manner from the center part 1C, the temperature distribution can be made in a state where the temperature difference is lower as moving towards the outer peripheral part. Thus, it is possible to keep the thermal efficiency. Furthermore, even when one of the thermoelectric element groups has an open circuit fault, the cooling operation can be continued in a state where the cooling ability gets lower.

Figure 7:
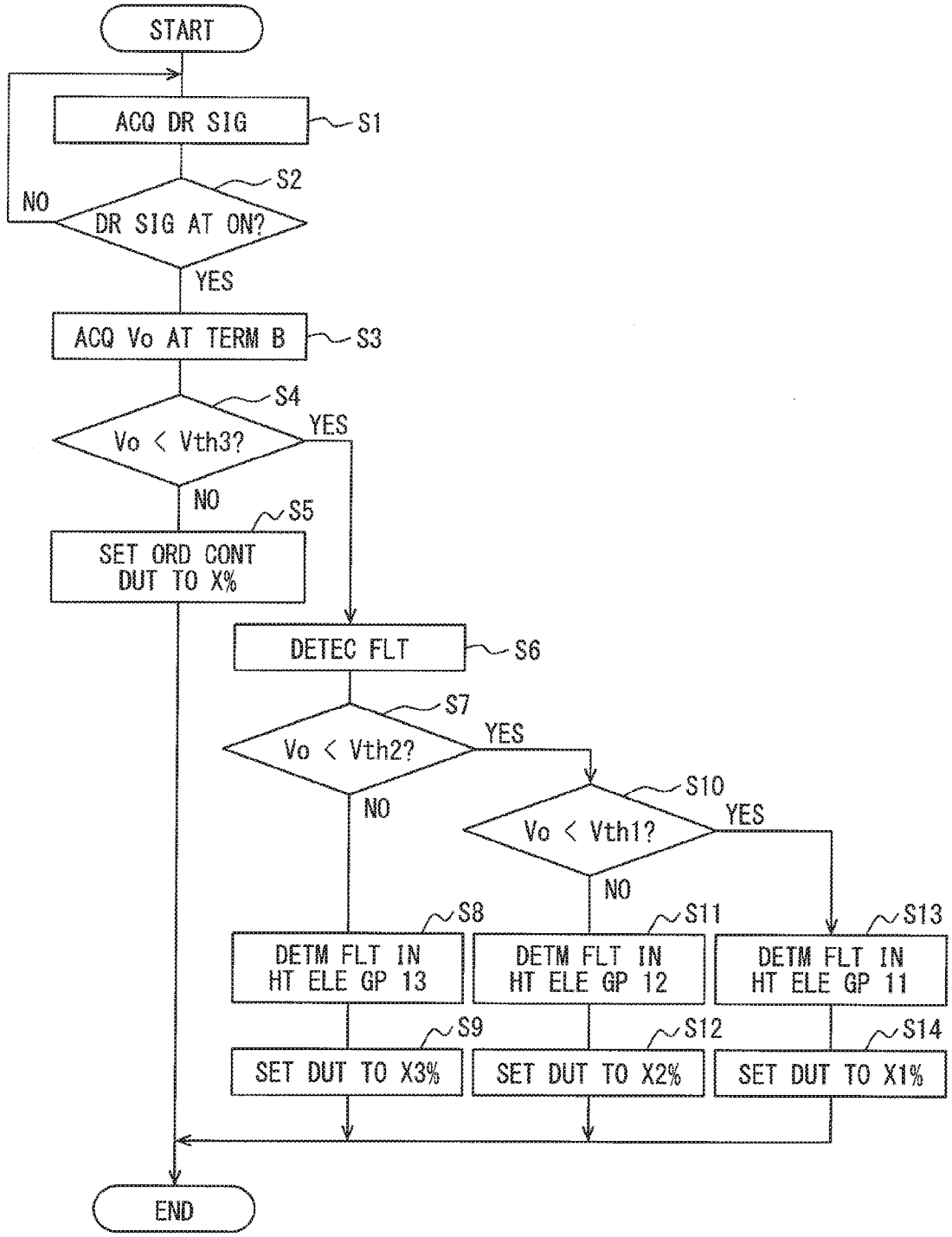
FIG. 7 is a flowchart that illustrates signal processing.

The following describes an operation of control of electrification to the thermoelectric element module 1 in reference to FIG. 7. The control of electrification to the thermoelectric element module 1 performs duty setting for a proper control operation according to a signal processing program illustrated in FIG. 7 and performs the driving of the MOSFET 2. Therefore, the thermoelectric element module 1 can perform the cooling operation by placing a semiconductor element, which is required to be cooled down, facing the surface at a heat absorption state, because the current I flows from the terminal A side towards the terminal B side; and the top surface side where the conductor 10c is arranged is at an heat absorption state and the mounted board 20 side is at the heat absorption side.

The control circuit 4 acquires a driving signal at step S1. When the acquired driving signal is not a driving signal at an ON-state, the control circuit 4 is in an idle state when NO is determined at step S2 and the processes at steps S1 and S2 are performed repetitively. When the control circuit 4 acquires a driving signal at an ON state at step S1, YES is determined at step S2 and processing is shifted to step S3.

The control circuit 4 acquires a voltage Vo of the terminal B at step S3. When the voltage Vo is detected, it is possible to calculate the current I flowing through the resistor 3 for current detection. Since the current I flows through the thermoelectric element module 1, it can be determined whether the control of electrification to the thermoelectric element module 1 is performed at a normal state based on the current I.

As mentioned above, since three thermoelectric element groups 11 to 13 are connected in parallel in the thermoelectric element module 1, the thermoelectric element module 1 has a constant combined resistance value. Since the power source voltage VD is constant, the value of the current I to be detected is constant, and the voltage Vo to be detected is also constant. Accordingly, the control of electrification to the thermoelectric element module 1 is determined to be at a normal state when the detected voltage Vo is at a constant level.

When one of the thermoelectric element groups 11 to 13 in the thermoelectric element module 1 has an open circuit fault, the detected voltage Vo changes due to a change in the combined resistance value. In this situation, since the respective resistance values R1, R2 and R3 of the three thermoelectric element groups 11 to 13 are set to be different, the combined resistance value changes as the detected voltage Vo changes in accordance with any of the three thermoelectric element groups having an open circuit fault.

By preliminarily setting threshold voltages Vth1 to Vth3 for recognizing four different values of detected voltage Vo, the control circuit 4 can determine whether each of the thermoelectric element groups 11 to 13 is in a normal state or in an open circuit state. In this situation, the value of the threshold voltage Vth1 is set to be the smallest value, and the value of the threshold voltage Vth3 is set to be the largest value. With regard to the following control, the duty ratio for controlling the MOSFET 2 driven by the control circuit 4 is set to be X % in a normal state, and is switched to be X1%, X2%, X3% at the time of having an open circuit fault. The relation of the above duty ratios is set to be X<X3<X2<X1.

The control circuit 4 determines whether the value of the detected voltage Vo is smaller than the value of the threshold voltage Vth3 at step S4. When the value of the detected voltage Vo is larger than or equal to the value of the threshold voltage Vth3 (i.e., NO at step S4), the control circuit 4 determines that thermoelectric element module 1 being in a normal state and shifts the processing to step S5, and carries out or maintains an ordinary control. In the state of ordinary control, the control circuit 4 sets the duty ratio at X %.

When YES is determined at step S4, since the control circuit 4 determines that one of the three thermoelectric element groups 11 to 13 has an open circuit fault, processing is shifted to step S6 and a fault detection is determined. Subsequently, the control circuit 4 determines which thermoelectric element group among the three thermoelectric element groups 11 to 13 has an open circuit fault.

The control circuit 4 determines whether the value of the detected voltage Vo is smaller than the value of the threshold voltage Vth2 at step S7. The control circuit 4 determines that the thermoelectric element group 13 is in a fault state as processing is shifted to step S8 when the detected voltage Vo is smaller than the threshold voltage Vth3 and is larger than or equal to Vth2 (i.e., NO at step S7). In this situation, the control circuit 4 sets the duty ratio to be X3% at step S9.

When the control circuit 4 determines that the detected voltage Vo is smaller than the threshold voltage Vth2 (i.e., YES at step S7), processing is shifted to step S10. The control circuit 4 determines whether the detected voltage Vo is lower than the threshold voltage Vth1 at step S10. The control circuit 4 determines that the thermoelectric element group 12 has a fault as processing is shifted to step S11 when the detected voltage Vo is smaller than the threshold voltage Vth2 and is larger than or equal to Vth1 (i.e., NO at step S10). In this situation, the control circuit 4 sets the duty ratio to be X2% at step S12.

The control circuit 4 determines that the detected voltage Vo is smaller than the threshold voltage Vth1 (i.e., YES at step S10), processing is shifted to step S13. The control circuit 4 determines that the thermoelectric element group 11 has a fault as processing is shifted to step S13 in the situation whether the detected voltage Vo is larger than or equal to the threshold voltage Vth1 (i.e., YES in step S10). In this situation, the control circuit 4 sets the duty ratio to be X1% at step S14.

As mentioned above, the control circuit 4 can controls the driving of the MOSFET 12 corresponding to the normal state or the fault state with a proper duty ratio since the signal processing program is terminated through any of steps S5, S9, S12 and S14. In addition, the control circuit 4 carries out the above mentioned signal processing program repetitively to continue the driving control properly by determining the operation state of the thermoelectric element module 1. Therefore, even when an open circuit fault occurs in any one of the three thermoelectric element groups 11 to 13, the cooling operation can be continued.

The following describes the relation between the detected voltage Vo and each of the threshold voltages Vth1 to Vth3 in the above configuration. Herein, the resistance value of the resistor R3 for detecting current is defined as Ro, and the resistance value of the thermoelectric element module 1 being in use is defined as Rx.

The detected voltage Vo(Rx) is defined as a voltage when the thermoelectric element module 1 has the resistance value Rx. In a situation where the power source voltage VD is applied to the resistors respectively having the resistance values Rx and Ro connected in series, the detected voltage Vo as the voltage across the resistor having the resistance value Ro can be expressed in the following mathematical expression (1).

$$Vo(Rx) = VD \cdot Ro/(Rx + Ro) = VD/(1 + (Rx + Ro)) \qquad (1)$$

As the resistance value Rx in the mathematical expression (1) gets smaller, the value of the detected voltage Vo gets larger.

The following illustrates how to obtain the values of the resistance Rx of the thermoelectric element module 1 individually.

When all of the thermoelectric element groups 11 to 13 are in a normal operation, as the resistance value Rx in this situation is defined as R(T), the following mathematical expression (2) is derived based on the situation where the resistors R1 to R3 are connected in parallel. In addition, when the thermoelectric element group 11 has an open circuit fault, as the resistance value in this situation is defined as R(1), the following mathematical expression (3) is derived based on the situation whether the resistors R2 and R3 are connected in parallel. Similarly, when the thermoelectric element groups 12, 13 have an open circuit fault respectively, as the resistance values in the respective situation are defined as R(2) and R(3), the following mathematical expressions (4) and (5) can be derived.

$$R(T)=R1 \cdot R2 \cdot R3/(R1 \cdot R2+R2 \cdot R3+R3 \cdot R1) \quad (2)$$

$$R(1)=R2 \cdot R3/(R2+R3) \quad (3)$$

$$R(2)=R1 \cdot R3/(R1+R3) \quad (4)$$

$$R(3)=R1 \cdot R2/(R1+R2) \quad (5)$$

The resistance values R1 to R3 of the three respective thermoelectric element groups 11 to 13, and their magnitude relation is expressed in the following mathematical expression (6).

$$R1<R2<R3 \quad (6)$$

In view of the magnitude relation shown in the above mathematical expression (6), when the magnitude relation among the resistance values R(T), R(1), R(2) and R(3) respectively shown in the respective mathematical expressions (2) to (5) are evaluated, the following mathematical expression (7) can be derived.

$$R(1)>R(2)>R(3)>R(T) \quad (7)$$

As a result, when the relation shown in the mathematical expression (7) is applied to the mathematical expression (1), the resistance values R(1), R(2) and R(3) according to the respective thermoelectric element groups 11 to 13, in a state where an open circuit fault occurs, have a magnitude relation as shown in the above expression, therefore, the relation shown in the following mathematical expression (8) can be obtained.

$$Vo(R(T))>Vo(R(3))>Vo(R(2))>Vo(R(1)) \quad (8)$$

Accordingly, when the threshold voltages Vth1 to Vth3 for recognizing the detected voltage Vo, which satisfies with the relation in the above mathematical expression (8), are set as shown in the following mathematical expressions (9) to (11), the threshold voltages for determining a fault in the above mentioned signal processing program can be set.

$$Vth3: Vo(R(T))>Vth3>Vo(R(3)) \quad (9)$$

$$Vth2: Vo(R(3))>Vth2>Vo(R(2)) \quad (10)$$

$$Vth1: Vo(R(2))>Vth1>Vo(R(1)) \quad (11)$$

For example, the following shows the particular values of the above-mentioned duty ratios X %, X1%, X2%, and X3%.

X %=50%;
X3%=55%;
X2%=70%; and
X1%=85%

It is noted that the above particular values are one of the examples to satisfy with the magnitude relation. However, when the number of thermoelectric elements 10 connected in series, the resistance value, or the driving condition changes, then the values of the duty ratios have to be set in different values accordingly.

In addition, when the thermoelectric element module 1 is turned into a fault state from a normal state, since it is rare that the plurality of thermoelectric element group have an open circuit fault at the same time, the control illustrated in FIG. 7 can be achieved. However, the threshold voltages can also be set to determine the situation where it is determined that two thermoelectric element groups have an open circuit fault in view of having a further open circuit fault, when the driving control of the thermoelectric element group 1 is continued after a fault occurs.

According to the present embodiment, since the thermoelectric element module 1 is configured such that the thermoelectric element groups 11 to 13 are connected in parallel; and the number of thermoelectric elements 10 connected in series is different in each of the thermoelectric element groups 11 to 13, the cooling operation can still be performed without losing the cooling ability even when one of the thermoelectric element groups 11 to 13 has an open circuit fault. In addition, since it is configured that the thermoelectric element groups 11 to 13 respectively have the resistance values R1, R2, and R3, which are different to each other, it is possible to identify which one of the thermoelectric element groups 11 to 13 has an open circuit fault based on the detected voltage Vo.

In this situation, the cooling ability can be maintained after the occurrence of a fault by detecting an open fault circuit or identifying a thermoelectric element group having a fault and then changing the setting of the duty ratio in accordance with the fault state based on a change in the resistance value Rx of the thermoelectric element module 1.

Since the thermoelectric element module 1 are configured to have only two terminals A and B and it is possible to continue the cooling operation at the time of having an open circuit fault or to identify a thermoelectric element group having an open circuit fault, it is easy to carry out wiring or implementation with the required minimum number of terminals.

With regard to the configuration of the thermoelectric element module 1, since the thermoelectric element group 11 with the fewer number of the thermoelectric elements 10 is arranged at the center part of the mounted board 20, in other words, the center part 1C of the thermoelectric element module 1; and the thermoelectric element group 13 is arranged at the outer peripheral side of the mounted board 20, the heat absorption ability can be made differently at the center part 1C and the outer peripheral part; in addition, the distribution of heat generation of an electronic component to be cooled down can be compensated; moreover, it is possible to improve the heat exchange efficiency by placing an electronic component with higher heat generation at the center part 1C.

In addition, since the each of the current paths in the respective thermoelectric element groups 11 to 13 is set to be in a direction, which is opposite to the direction in the adjacent current path, the influence of noise can be inhibited. Moreover, the thermoelectric element groups 11 to 13 are disposed concentrically from the center part 1C to the outer peripheral part, therefore, the temperature irregularity at the heat absorption portion when having an open circuit fault can be minimized.

(Second Embodiment)

Figure 8:
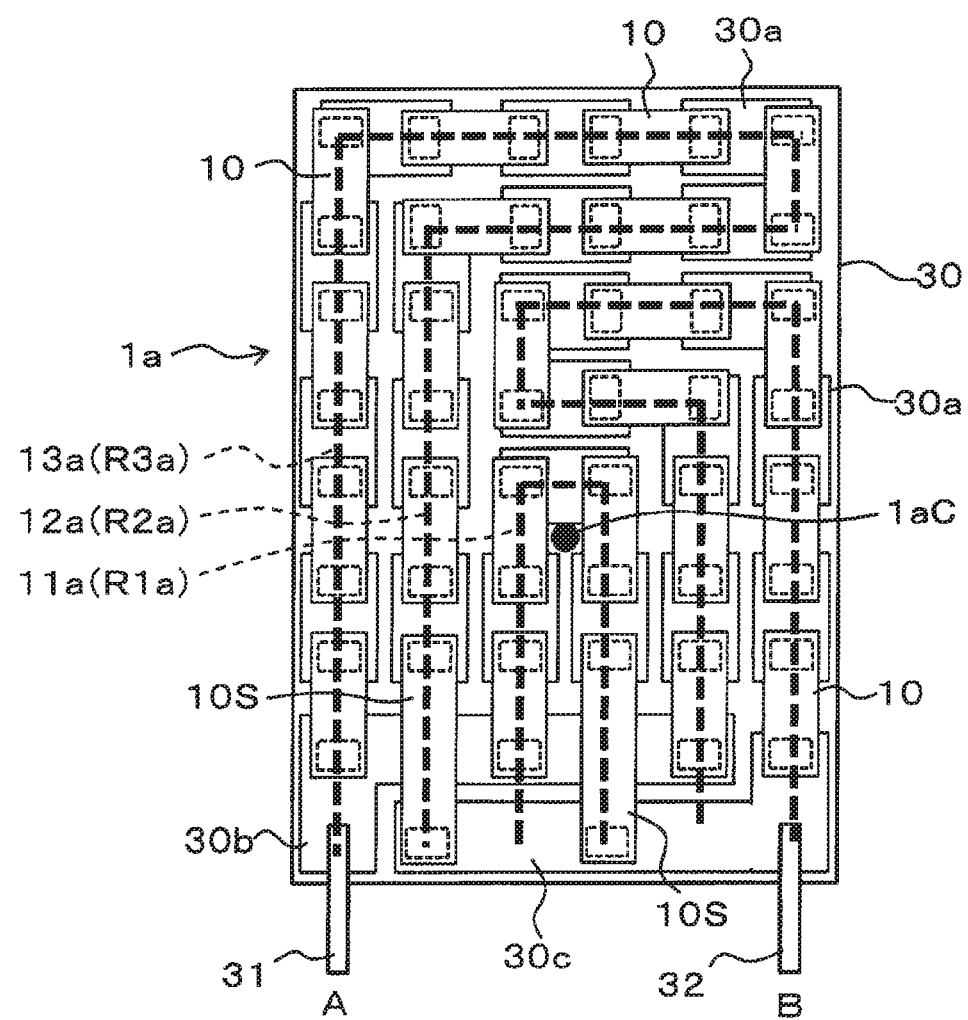
FIG. 8 is a drawing that illustrates a plan view of a thermoelectric element module according to a second embodiment.
Figure 9:
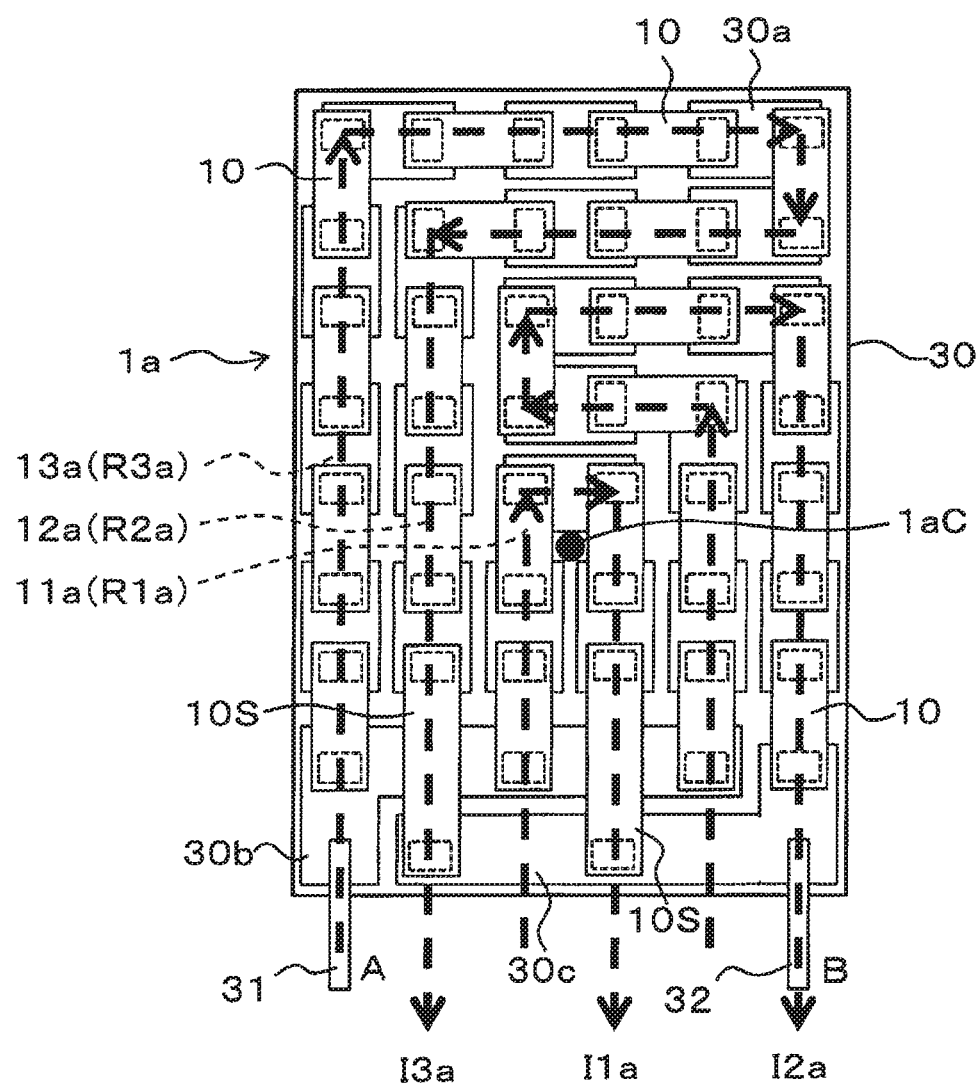
FIG. 9 is a drawing that illustrates a current flowing path in the thermoelectric element module.

FIGS. 8 and 9 illustrate a second embodiment. Thus, the following only describes the parts, which are different from the ones in the first embodiment. In this embodiment, the arrangement in the thermoelectric element group 1a is illustrated in FIG. 8. In the second embodiment, the thermoelectric element group 11a is arranged at the center part 1C of the thermoelectric element module 1a, and the thermoelectric element groups 12a and 13a are arranged at the outer peripheral side of the thermoelectric element module 1a.

In addition, with regard to the thermoelectric element module 1a, three thermoelectric element groups 11a, 12a and 13a are arranged on the mounted board 30 as illustrated in FIG. 8. The thermoelectric element groups 11a, 12a and 13a respectively have four, eight and twelve thermoelectric elements 10 connected in series. The thermoelectric element groups 11a, 12a and 13a respectively have the resistance values R1a, R2a and R3a. In this situation, the resistance values R2a and R3a are respectively two times and three times larger than the resistance value R1a.

As shown in FIG. 9, the thermoelectric element group 11a is formed in a rectangular shape, and is arranged at the center part 1aC of the thermoelectric element module 1a. The thermoelectric element group 12a is arranged along one side (for example, left side) of the thermoelectric element group 11a and folded back so as to be bent in an L-shape. The thermoelectric element group 13a is arranged to be folded back so as to be bent in an L-shape along another side (for example, right side) of the thermoelectric element group 11a and one part of the thermoelectric element group 12a.

In this configuration, although the thermoelectric element groups 12a and 13a are not arranged concentrically to surround the thermoelectric element group 11a, the thermoelectric element groups 12a and 13a are arranged to be situated at the outer peripheral side. Additionally, when the current flows from the terminal A to the terminal B, the path of the current flowing through each of the thermoelectric element groups 11a to 13a is set to be in a direction, which is in a reverse direction of the current flowing through the adjacent path. Thus, the generation of noise can be inhibited.

Although the configuration of the second embodiment is different from the configuration of the first embodiment, both of the embodiments generate functional effects similarly. It is noted that the effects generated by the concentric arrangement of the thermoelectric element groups 11 to 13 in the first embodiment cannot be achieved directly in the second embodiment. However, two thermoelectric element groups 12a and 13a are arranged to surround the thermoelectric element group 11a with the higher cooling ability, therefore, the effect similar to the one generated in the first embodiment can be attained.

Figure 10:
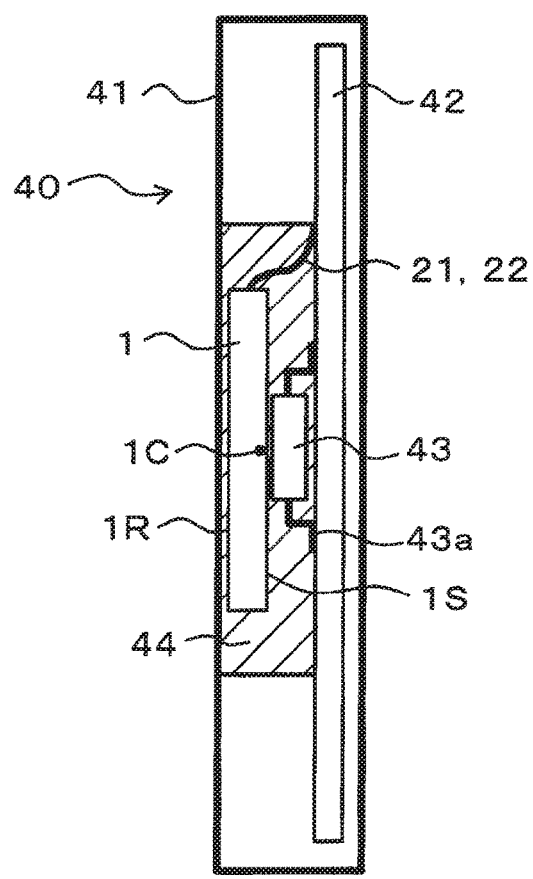
FIG. 10 is a drawing that illustrates a cross sectional side view of a configuration according to a third embodiment.

FIG. 10 illustrates an example of implementation of the thermoelectric element module 1 shown in the first embodiment to the electronic control device having an electronic component to be cooled down.

The electronic control device 40 accommodates a circuit board 42 inside a housing 41, which is formed into a rectangular container shape made of heat radiating material. On the surface of the circuit board 42, an electronic component 43 or the like is mounted through a lead wire 43a in an electrical connection state.

The electronic component 43, which is a heat generation object during operation, is arranged in such a manner that the center part 1C of the surface 1S of the thermoelectric element module 1 for cooling down the electronic component 43 at the heat absorption side faces the electronic component 43; and the surface 1R of the thermoelectric element module 1 at the heat radiation side faces the housing 41. The lead wires 21, 22 of the thermoelectric element module 1 are electrically connected to the circuit board 42. A heat conductive member 44 such as silicon resin for making better heat conduction is filled so as to not producing gap between the electronic component 43 and the thermoelectric element module 1 and between the housing 41 and thermoelectric element module 1.

By adopting the above configuration, the heat generated by the electronic component 43 is absorbed by the surface 1S of the thermoelectric element module 1 at the heat absorption side and conducted to the housing 41 side with better efficiency, Accordingly, it can be avoided that the working ability of the electronic component deteriorates due to heat generation.

(Fourth Embodiment)

Figure 11:
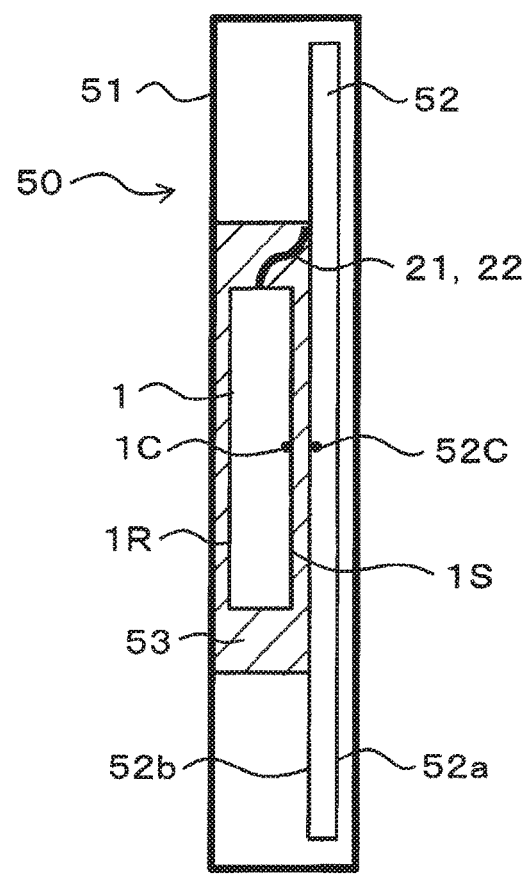
FIG. 11 is a drawing that illustrates a cross sectional side view of a configuration according to a fourth embodiment.

FIG. 11 illustrates a fourth embodiment. The following illustrates the parts, which are different from the ones described in the third embodiment. In the third embodiment, the thermoelectric element module 1 is arranged to be facing the electronic component to be cooled down. In this present embodiment, the electronic component is not directly to be cooled down; however, the circuit board on which the electronic is mounted is cooled down.

The electronic control device 50 accommodates the circuit board 52 inside the housing 51, which is formed into a rectangular container shape made of heat radiating material. In this embodiment, the electronic component (not shown) is arranged on the mounted surface 52a of the circuit board 52; and the circuit board 52 has a heat radiating part 52C for allowing the heat generated by the electronic component to be conducted to the surface 52b facing the mounted surface 52a.

The thermoelectric element module 1 is arranged inside the housing 51 so as to face the surface 52b of the circuit board 52 at the heat generation side. The thermoelectric element module 1 is arranged such that the center part 1C of the surface 1S at the heat absorption side faces the heat radiating part 52C, which generates the largest amount of heat, of the circuit board 52. The lead wires 21, 22 of the thermoelectric element module 1 are electrically connected to the circuit board 52. A heat conductive member 53 such as silicon resin for making better heat conduction is filled between the circuit board 52 and the thermoelectric element module 1 and between the housing 51 and the thermoelectric element module 1.

By adopting the above configuration, the heat generated by the circuit board 52 is absorbed by the surface 1S of the thermoelectric element module 1 at the heat absorption side and is conducted to the housing 51 with better efficiency. Accordingly, it can be avoided that the working ability of the electronic component mounted on the circuit board 52 deteriorates due to heat generation.

(Other Embodiment)

The present disclosure is not only limited to the above embodiments, however, it is also applicable to various embodiments within the spirit and scope of the present disclosure. The following shows examples of various modification and arrangements.

The above embodiments illustrate that the thermoelectric element module 1, 1a respectively include three thermoelectric element groups 11 to 13 and three thermoelectric element groups 11a to 13a. However, it is not restricted to this case. The thermoelectric element module may be configured to include four or more thermoelectric element groups.

As long as the thermoelectric element module is configured to have thermoelectric element groups, which respectively have different resistance values, being connected in parallel, a variety of configurations other than the configurations described in the above embodiments can also be adopted. For example, changing the number of thermoelectric elements being connected in each of the thermoelectric element groups to adjust a resistance value to be a different value can also be achieved. Additionally, setting the arrangement pattern of the thermoelectric element groups to a different shape of pattern can also be achieved.

Moreover, in a situation where it is not necessary to consider the influence of noise, it is not needed to set the current flow path in a direction opposite to the current flow direction in the adjacent current flow path. The present disclosure is also applicable to a variety of arrangement patterns.

While the present disclosure has been described with reference to embodiments thereof, it is to be understood that the disclosure is not limited to the embodiments and constructions. The present disclosure is intended to cover various modification and equivalent arrangements, In addition, while the various combinations and configurations, other combinations and configurations, including more, less or only a single element, are also within the spirit and scope of the present disclosure.

What is claimed is:

1. An electronic control device, comprising:
a thermoelectric element module that includes a plurality of thermoelectric element groups, all of which are connected in parallel to each other; and
a control circuit that supplies a driving power to the thermoelectric element module to perform an operation control of the thermoelectric element module, wherein:
each of the plurality of thermoelectric element groups has a plurality of thermoelectric elements, which are connected in series;
each of the plurality of thermoelectric elements includes a pair of a p-type semiconductor and an n-type semiconductor;
each of the plurality of thermoelectric element groups has a different number of the thermoelectric elements;
the thermoelectric element module includes two power input terminals; and
all of the plurality of thermoelectric element groups are connected in parallel by being connected to two connection conductors that are connected to the two power input terminals.

2. The electronic control device according to claim 1, wherein:
a thermoelectric element group having a fewest number of the thermoelectric elements is arranged at a center part of the thermoelectric element module;
and each of a remainder of the plurality of thermoelectric element groups is arranged at an outer part of the thermoelectric element module.

3. The electronic control device according to claim 2, wherein:
each of the remainder of the plurality of thermoelectric element groups is arranged around the thermoelectric element group having the fewest number of the thermoelectric elements in the thermoelectric element module.

4. The electronic control device according to claim 2,
wherein the plurality of thermoelectric element groups are arranged in the thermoelectric element module such that
current paths flowing through respective thermoelectric element groups are configured into a shape concentrically surrounding a center position of the thermoelectric element module, and
adjacent current paths flow in opposite directions.

5. The electronic control device according to claim 1, wherein:
the control circuit includes a detector, which detects a resistance value across the two power input terminals of the thermoelectric element module;
the control circuit determines whether or not an open circuit fault occurred in one of the plurality of thermoelectric element groups based on the resistance value detected by the detector; and
the control circuit performs the operation control of the thermoelectric element groups that do not have the open circuit fault.

6. The electronic control device according to claim 1, further comprising:
a heat conductive member;
a housing that is made of heat radiating material; and
a circuit board that is accommodated in the housing, wherein:
the circuit board generates heat inside the housing; and
the thermoelectric element module is arranged at at least one of
a position between an inner surface of the housing and an electronic component mounted on the circuit board through the heat conductive member, and
a position between the inner surface of the housing and the circuit board through the heat conductive member.

7. The electronic control device according to claim 2, further comprising:
a heat conductive member;
a housing that is made of heat radiating material; and
a circuit board that is accommodated in the housing, wherein:
the circuit board generates heat inside the housing;
the thermoelectric element module is arranged at at least one of a position between an inner surface of the housing and an electronic component mounted on the circuit board through the heat conductive member, and a position between the inner surface of the housing and the circuit board through the heat conductive member; and
the thermoelectric element module is arranged such that the thermoelectric element group having the fewest number of the thermoelectric elements faces a region of the circuit board having a largest amount of heat generation.

* * * * *